US012785423B2

(12) United States Patent
Park

(10) Patent No.: US 12,785,423 B2
(45) Date of Patent: Nov. 3, 2026

(54) CIRCUIT FOR MEASURING BATTERY CELL VOLTAGE AND CONTROL METHOD THEREOF

(71) Applicant: HYUNDAI MOBIS Co., Ltd., Seoul (KR)

(72) Inventor: Joon Ho Park, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 666 days.

(21) Appl. No.: 18/090,017

(22) Filed: Dec. 28, 2022

(65) Prior Publication Data

US 2023/0268747 A1 Aug. 24, 2023

(30) Foreign Application Priority Data

Feb. 23, 2022 (KR) ........................ 10-2022-0023668

(51) Int. Cl.

| | |
|---|---|
| ***H01M 10/46*** | (2006.01) |
| ***G01R 31/3835*** | (2019.01) |
| ***H01M 10/48*** | (2006.01) |
| ***H02J 7/60*** | (2026.01) |
| ***H02J 7/80*** | (2026.01) |

(52) U.S. Cl.

CPC ............ *H02J 7/60* (2026.01); *G01R 31/3835* (2019.01); *H01M 10/482* (2013.01); *H02J 7/80* (2026.01)

(58) Field of Classification Search

CPC ...... H02J 7/0029; H02J 7/0047; H02J 7/0048; H02J 7/0036; G01R 31/396; G01R 31/385; G01R 19/0084; G01R 1/36; H01M 10/482

USPC ................. 320/107, 116, 117, 119, 134, 136

See application file for complete search history.

(56) References Cited

U.S. PATENT DOCUMENTS

2006/0012336 A1* 1/2006 Fujita .................. H01M 50/569 320/119
2010/0052656 A1* 3/2010 Tanaka ............. G01R 19/16542 324/123 R
2016/0377685 A1 12/2016 Makino et al.
2019/0285669 A1 9/2019 Furukawa
2019/0293725 A1 9/2019 Tsuchiya et al.

FOREIGN PATENT DOCUMENTS

KR 10-1362850 B1 2/2014
KR 10-1527136 B1 6/2015
KR 10-2021-0102442 A 8/2021
WO 2021/186795 A1 9/2021

OTHER PUBLICATIONS

Partial European Search Report issued Jul. 14, 2023 in the corresponding European Patent Application No. 22210769.0.
Notice of Allowance issued on Jan. 30, 2026 in the corresponding Korean Patent Application No. 10-2022-0023668 (Note: 2016/0377685 A1 , US2019/0285669 A1 , previously cited therein is already of record.

* cited by examiner

*Primary Examiner* — Edward Tso

(74) *Attorney, Agent, or Firm* — Morgan, Lewis & Bockius LLP

(57) ABSTRACT

A circuit for measuring a battery cell voltage includes: a plurality of battery cells included in a battery stack; a device that measures a battery cell voltage; a protection circuit connected in parallel to each terminal of the device that measures the battery cell voltage; and an external power supply that applies power to the protection circuit.

6 Claims, 3 Drawing Sheets

CIRCUIT FOR MEASURING BATTERY CELL VOLTAGE AND CONTROL METHOD THEREOF

CROSS-REFERENCE TO RELATED APPLICATION

This application claims priority from and the benefit of Korean Patent Application No. 10-2022-0023668, filed on Feb. 23, 2022, which is hereby incorporated by reference for all purposes as if set forth herein.

BACKGROUND

Field

Embodiments of the disclosure relate to a circuit for measuring a battery cell voltage and a control method thereof, and more particularly, to a circuit for measuring a battery cell voltage, which may prevent damage to a device that measures a battery cell voltage when a reverse voltage occurs in a battery cell, and a control method thereof.

Discussion of the Background

In general, an electric vehicle (EV) or a hybrid electric vehicle (HEV) may drive an electric motor by using a battery (including a fuel cell or hydrogen cell).

It is thus necessary to measure (or monitor) a voltage of each cell in the battery (including the fuel cell or the hydrogen cell) for voltage control (e.g., voltage balancing control for minimizing a voltage difference between the cells). This method may prevent the over-voltage or under-voltage of the battery so that the battery safely has a long lifespan.

A circuit for measuring a battery cell voltage that is used here may typically include a multiplexer (MUX) for selecting one of a plurality of battery cells, and an analog-to-digital converter (ADC) that converts a value output through the multiplexer (MUX) into a digital value (see FIGS. 1 to 3).

Here, a device (e.g., BMS sensing IC) that measures a battery cell voltage including the MUX may include one sensing channel that senses a constant voltage of zero to 5V.

However, a reverse voltage may unusually occur in the battery cell (of a hydrogen battery, especially). In this case, a conventional circuit for measuring a battery cell voltage includes no protection circuit corresponding to the reverse voltage, and fire damage may thus occur in the device (e.g., BMS Sensing IC) that measures a battery cell voltage. The battery cell may also be damaged when the reverse voltage continues.

For example, the battery mounted in the electric vehicle may include the plurality of cells stacked on each other in series. Therefore, the circuit for measuring a battery cell voltage (or a battery management system (BMS)) may include the devices (e.g., BMS Sensing ICs) that measure dozens of battery cell voltages to monitor the battery cells. Therefore, the entire BMS may need to be replaced when the reverse voltage occurs to cause the fire damage to the device that measures a specific battery cell voltage. In addition, a huge cost may be incurred because the entire battery needs to be replaced even when only one cell is damaged.

Accordingly, required is a circuit for measuring a battery cell voltage, including a protection circuit for preventing the battery cell in the circuit for measuring a battery cell voltage (or the BMS) from being fire-damaged due to the reverse voltage when the reverse voltage unusually occurs in the battery cell.

Background technology of the disclosure is disclosed in Korean Patent No. 10-1527136 (registered on Jun. 2, 2015, and entitled, "APPARATUS FOR DIAGNOSING BATTERY OF ELECTRIC VEHICLE AND METHOD THEREOF").

SUMMARY

Various embodiments are directed to a circuit for measuring a battery cell voltage, which may prevent damage to a device that measures a battery cell voltage when a reverse voltage occurs in a battery cell, and a control method thereof.

In an embodiment, a circuit for measuring a battery cell voltage includes: a plurality of battery cells included in a battery stack; a device that measures a battery cell voltage; a protection circuit connected in parallel to each terminal of the device that measures the battery cell voltage; and an external power supply that applies power to the protection circuit.

The protection circuit may include a diode ($D_{PU}$) connected in series to a resistor ($R_{PU}$).

In the protection circuit, an anode of the diode ($D_{PU}$) may be connected to an anode of the external power supply through a power terminal ($V_{PU}$) of the device that measures the battery cell voltage.

In the protection circuit, a cathode of the diode ($D_{PU}$) may be connected to one end of the resistor ($R_{PU}$), and the other end of the resistor ($R_{PU}$) may be connected to one of terminals ($V_{CO}$, $V_{C1}$ or $V_{C2}$) of the device that measures the battery cell voltage.

In the battery stack, a cathode of the lowest battery cell, among the plurality of battery cells, may be commonly connected to a cathode of the external power supply and a ground terminal (GND) of the device that measures the battery cell voltage.

In the battery stack, the cathode of the lowermost battery cell may be commonly connected to the cathode of the external power supply and the ground terminal (GND) of the device that measures the battery cell voltage through a bottom resistor ($R_{BOTTOM}$) and a bottom diode ($D_{BOTTOM}$) connected in parallel thereto.

One end of the bottom resistor ($R_{BOTTOM}$) may be connected to a cathode of the bottom diode ($D_{BOTTOM}$) and the cathode of the lowest battery cell in the battery stack, and the other end thereof may be commonly connected to an anode of the bottom diode ($D_{BOTTOM}$), the cathode of the external power supply, and the ground terminal (GND) of the device that measures a battery cell voltage.

In the device that measures a battery cell voltage, each terminal ($V_{CO}$, $V_{C1}$ or $V_{C2}$) and a cathode of each battery cell may be connected in series with each other through a resistor ($R_{PU}$), and a capacitor ($C_F$) may be connected in parallel between each terminal ($V_{CO}$, $V_{C1}$ or $V_{C2}$) and each resistor ($R_{PU}$).

In another embodiment, a control method of a circuit for measuring a battery cell voltage includes: sensing, by a controller, occurrence of a reverse voltage in a battery cell of a battery; outputting, by the controller, a reverse voltage-sensing signal and transmitting the same to a hydrogen charging system for charging hydrogen into the battery cell when sensing the occurrence of the reverse voltage in the battery cell; checking, by the controller, whether the reverse voltage of the battery cell is resolved; and stopping the output of the reverse voltage-sensing signal when the reverse voltage of the battery cell is resolved.

The battery may include a hydrogen cell, and the reverse voltage of the battery cell may be resolved when the hydrogen charging system charges hydrogen into the battery in response to the reverse voltage-sensing signal.

As set forth above, in accordance with the embodiments of the disclosure, it is possible to prevent the fire damage to the device that measures a battery cell voltage and the battery cell itself when the reverse voltage occurs in the battery cell.

BRIEF DESCRIPTION OF THE DRAWINGS

FIG. 4 is a flowchart for explaining an operation of a controller (or a micro controller (MCU)) when a reverse voltage occurs in a battery cell of FIG. 3.

DETAILED DESCRIPTION OF THE ILLUSTRATED EMBODIMENTS

Hereinafter, a circuit for measuring a battery cell voltage and a control method thereof will be described below with reference to the accompanying drawings through various embodiments.

It should be noted that the drawings may be exaggerated in thickness of lines or sizes of components for clarity and convenience of explanation. In addition, terms described below are those defined in consideration of functions in the disclosure, and may be construed in different ways by the intention of users, operators or practice. Therefore, definition of the terms should be made based on the contents throughout the specification.

Figure 1:
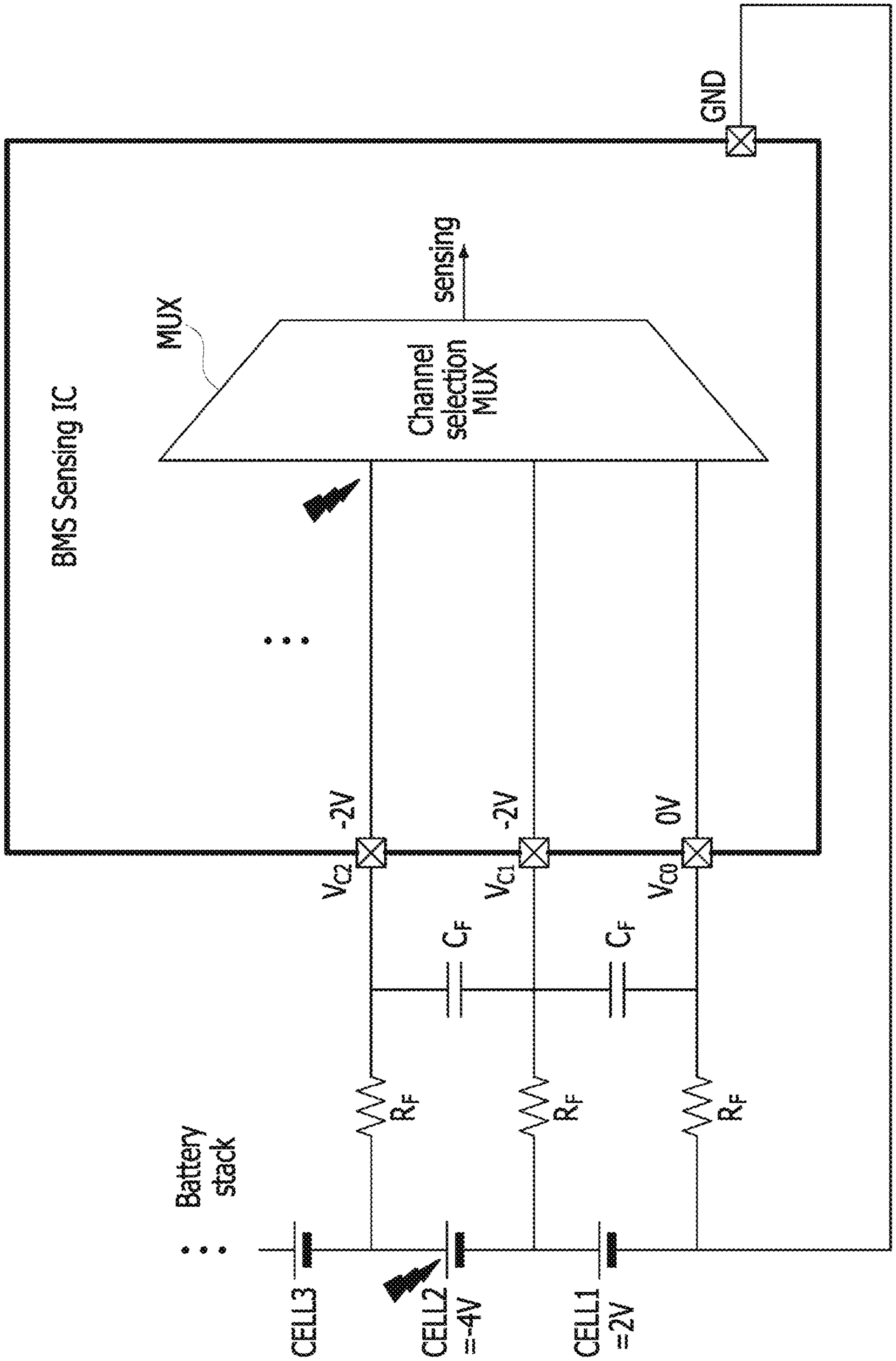
FIG. 1 is an exemplary view showing a schematic configuration of a general circuit for measuring a battery cell voltage.

FIG. 1 is an exemplary view showing a schematic configuration of a general circuit for measuring a battery cell voltage. As shown in FIG. 1, the conventional general circuit for measuring a battery cell voltage may include a device (e.g., BMS Sensing IC) that measures voltages of a plurality of battery cells (e.g., CELL1, CELL2, and CELL3) of a battery stack; each terminal ($V_{CO}$, $V_{C1}$ or $V_{C2}$) of the device (e.g., BMS Sensing IC) that measures a battery cell voltage and a cathode of each battery cell may be connected in series with each other through a resistor ($R_F$); a capacitor $C_F$ may be connected in parallel between each terminal ($V_{CO}$, $V_{C1}$ or $V_{C2}$) and each resistor ($R_F$); and a ground terminal (GND) of the device (e.g., BMS Sensing IC) that measures a battery cell voltage and a cathode of the lowest battery cell (e.g., CELL1) of the battery stack may be commonly connected to each other.

Here, a reverse voltage may unusually occur in any one battery cell (e.g., CELL2) (of a hydrogen battery, especially). In this case, fire damage may occur in the device (e.g., BMS Sensing IC) that measures a battery cell voltage through the terminal $V_{C2}$ connected to the anode of the battery cell (e.g., CELL2) (or the cathode of the upper battery cell (CELL3) connected in series). The battery cell (e.g., CELL2) may also be damaged when the reverse voltage continues.

Accordingly, required is a circuit for measuring a battery cell voltage, including a protection circuit for preventing the fire damage to the device that measures a battery cell voltage and the battery cell.

Figure 2:
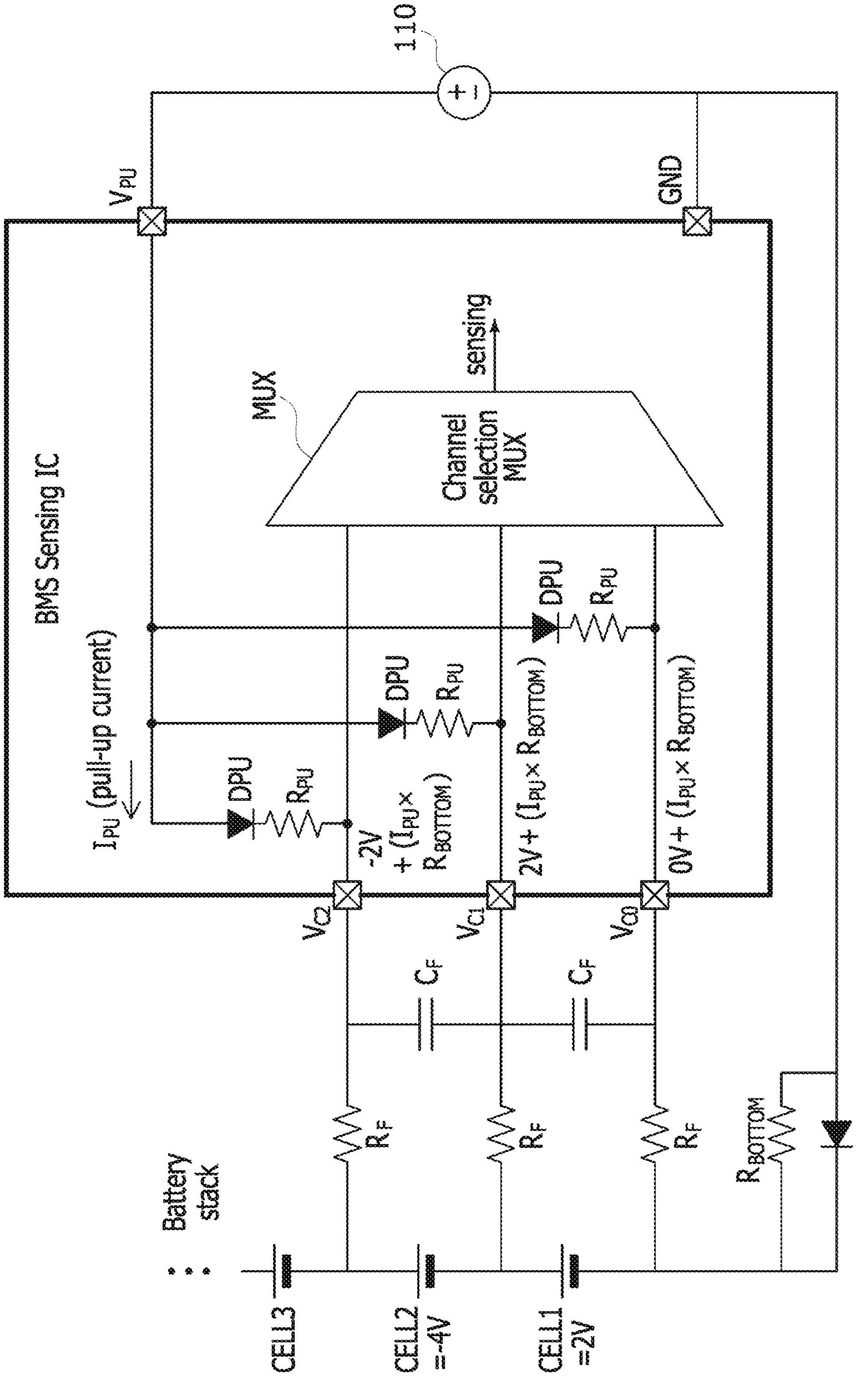
FIG. 2 is an exemplary view showing a schematic configuration of a circuit for measuring a battery cell voltage including a protection circuit according to an embodiment of the disclosure.

FIG. 2 is an exemplary view showing a schematic configuration of a circuit for measuring a battery cell voltage including a protection circuit according to an embodiment of the disclosure.

FIG. 2 shows that in the circuit of FIG. 1, the protection circuit including a diode ($D_{PU}$) connected in series with a resistor ($R_{PU}$) may be connected in parallel with each terminal ($V_{CO}$, $V_{C1}$ or $V_{C2}$) of the device (e.g., BMS Sensing IC) that measures a battery cell voltage.

In the protection circuit, an anode of the diode ($D_{PU}$) may be connected to an anode of an external power supply 110 through a power terminal ($V_{PU}$) of the device (e.g., BMS Sensing IC) that measures a battery cell voltage; a cathode of the diode ($D_{PU}$) may be connected to one end of the resistor ($R_{PU}$); the other end of each resistor ($R_{PU}$) may be connected to each terminal ($V_{CO}$, $V_{C1}$ or $V_{C2}$) of the device (e.g., BMS Sensing IC) that measures a battery cell voltage; and a cathode of the lowermost battery cell (CELL1) in the battery stack may be commonly connected to a cathode of the external power supply 110 and a ground terminal (GND) of the device (e.g., BMS Sensing IC) that measures a battery cell voltage through a bottom resistor ($R_{BOTTOM}$) and a bottom diode ($D_{BOTTOM}$) connected in parallel thereto.

In more detail, one end of the bottom resistor ($R_{BOTTOM}$) and a cathode of the bottom diode ($D_{BOTTOM}$) may be connected to the cathode of the lowest battery cell (CELL1) of the battery stack, and the other end of the bottom resistor ($R_{BOTTOM}$) and an anode of the bottom diode ($D_{BOTTOM}$) may be commonly connected to the cathode of the external power supply 110 and the ground terminal GND of the device (e.g., BMS Sensing IC) that measures a battery cell voltage.

Here, a voltage supplied from the external power source 110 may be less than or equal to the battery cell voltage (e.g., 5V), and a minimum current (e.g., several μA) may be supplied therefrom.

For example, it may be assumed that the reverse voltage occurs in one (e.g., CELL2) of the battery cells in FIG. 2. For example, the reverse voltage such as CELL1=2V and CELL2=−4V may occur in CELL2, and in this case, a negative voltage may be applied to the terminal (e.g., $V_{C2}$) of the device (e.g., BMS Sensing IC) that measures a battery cell voltage in response thereto. In this way, the negative voltage may be applied to a multiplexer (MUX), and in this case, fire damage may occur in a device included in the MUX, thereby making a normal operation of a corresponding channel impossible. In addition, the battery cell (e.g., CELL2) may also be damaged when the reverse voltage is continuously left as in the battery cell.

Here, in this embodiment, a potential of the terminal (e.g., $V_{C2}$) of the device (e.g., BMS Sensing IC) that measures a battery cell voltage may be lower than a potential of the power terminal ($V_{PU}$) connected to the external power supply 110 when the negative voltage is applied to the terminal (e.g., $V_{C2}$). Therefore, a pull-up current may flow along a yellow path (that is, anode of external power supply 110→power terminal ($V_{PU}$)→protection circuit→battery cell (CELL2) with reverse voltage occurrence→lowest battery cell (CELL1) of battery stack→bottom resistor ($R_{BOTTOM}$)→cathode of external power supply 110), thereby increasing the potential of each terminal ($V_{CO}$, $V_{C1}$ or $V_{C2}$) of the device (e.g., BMS Sensing IC) that measures a battery cell voltage by input current ($I_{PU}$)×bottom resistance ($R_{BOTTOM}$).

As a result, the potential of the terminal ($V_{C2}$) that measures a voltage of the battery cell (e.g., CELL2) in which the reverse voltage occurs may be increased and changed to a positive voltage, thereby protecting the device (e.g., BMS Sensing IC) that measures a battery cell voltage to prevent the damage thereto.

Here, the current supplied from the external power supply 110 may be very small (e.g., several ρA), and an effect on a battery cell voltage-measurement value may not be significant. Furthermore, the battery cell voltage in this embodiment may be obtained by measuring a relative voltage of each battery cell connected to the stack, the potential of each terminal ($V_{CO}$, $V_{C1}$ or $V_{C2}$) of the device (e.g., BMS Sensing IC) that measures a battery cell voltage may thus be equally increased, and there may thus be no change in the relative voltage of each battery cell.

Figure 3:
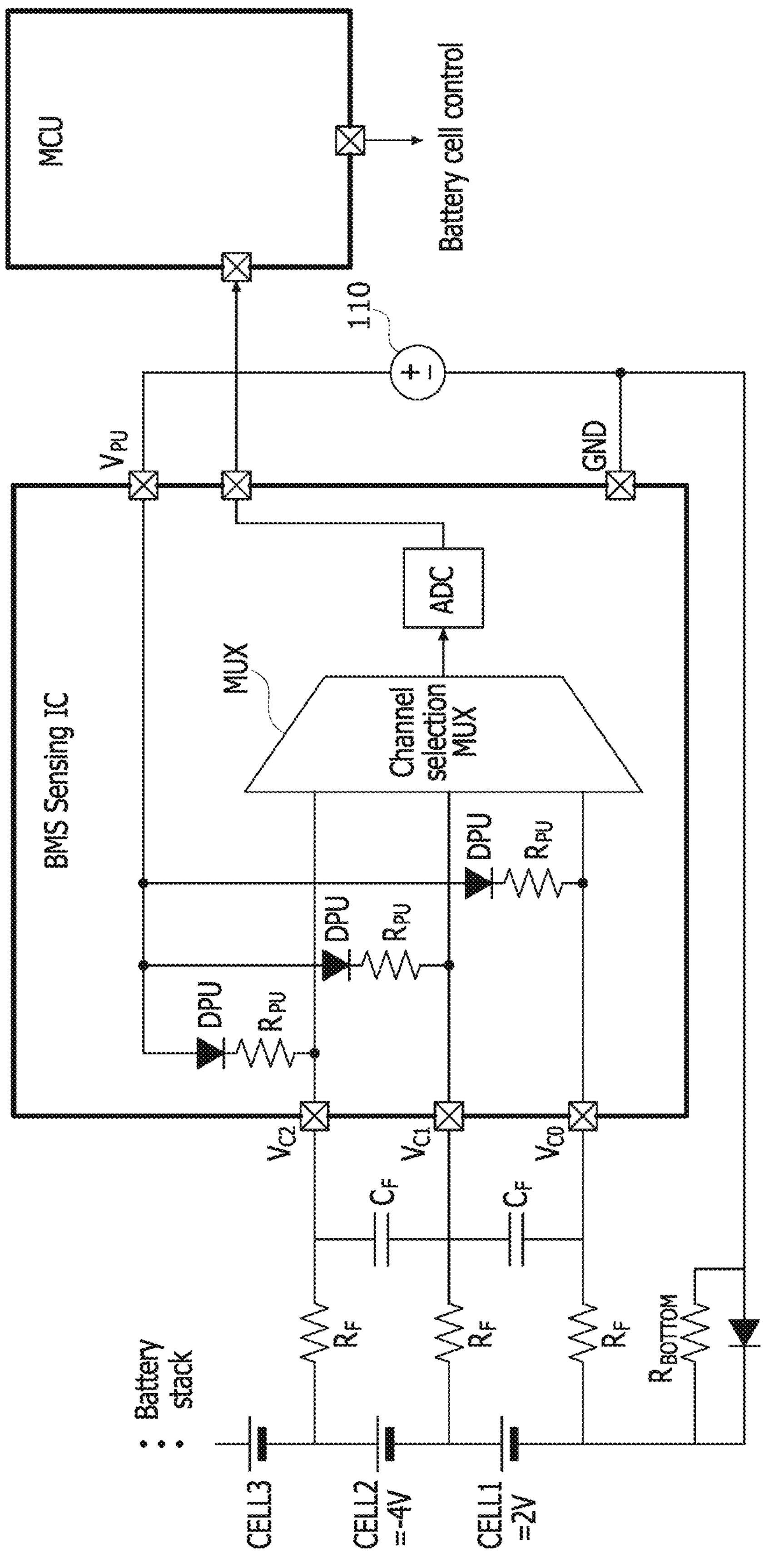
FIG. 3 is an exemplary view for explaining an operation of measuring a battery cell voltage when a reverse voltage occurs in the circuit of FIG. 2.

FIG. 3 is an exemplary view for explaining an operation of measuring a battery cell voltage when a reverse voltage occurs in the circuit of FIG. 2. Here, the battery cell voltage may be monitored in such a manner that the voltage of the battery cell (e.g., CELL2) in which the reverse voltage occurs is changed to the positive voltage by the current applied through the protection circuit, the positive voltage measured through the device (e.g., BMS Sensing IC) that measures a battery cell voltage is transmitted to an analog-to-digital converter (ADC) through the MUX, and the battery cell voltage-measurement value converted into a digital value through the ADC is normally applied to a controller (or a micro controller (MCU)).

Accordingly, the controller (or MCU) may control (e.g., output an alarm signal) the battery cell (e.g., CELL2) in which the reverse voltage occurs to be changed to have a constant voltage based on the battery cell voltage (see FIG. 4).

FIG. 4 is a flowchart for explaining an operation of the controller (or the micro controller (MCU)) when a reverse voltage occurs in the battery cell of FIG. 3. The reverse voltage of the battery cell may be sensed (Yes in S101), and in this case, the controller (MCU) may output a reverse voltage-sensing signal (or alarm signal) and transmitting the same to a higher system (e.g., a hydrogen charging system, not shown) (S102).

Here, the higher system (e.g., the hydrogen charging system, not shown) may be a system for charging (or injecting) hydrogen into the battery when the battery includes a hydrogen cell. The reverse voltage may be resolved when the higher system (e.g., the hydrogen charging system, not shown) that receives the reverse voltage-sensing signal (or alarm signal), charges hydrogen into the battery.

Therefore, the controller (MCU) may output the reverse voltage-sensing signal (or alarm signal) until the reverse voltage of the battery cell is resolved (No in S103), and stop the output of the reverse voltage-sensing signal (or alarm signal) when the reverse voltage of the battery cell is resolved (Yes in S103).

As a result, the circuit according to this embodiment may prevent the battery cell in which the reverse voltage occurs from being exposed to the reverse voltage situation, thereby preventing the fire damage to the device that measures a battery cell voltage and the battery cell itself.

As described above, the disclosure has been described with reference to the embodiments shown in the drawings. However, these embodiments are only examples, and those skilled in the art to which the disclosure pertains will appreciate that various modifications and other equivalent embodiments are possible. Thus, the technical scope of the disclosure should be defined by the following claims. In addition, the implementation described herein may be implemented in, for example, a method or process, an apparatus, a software program, a data stream, or a signal. Although the implementation is disclosed only in a single form (e.g., only as a method), the implementation of the disclosed feature may also be implemented in another form (e.g., as an apparatus or a program). The apparatus may be implemented in suitable hardware, software, firmware, or the like. For example, the method may be implemented in the apparatus such as a processor which generally refers to a computer, a micro-processor, a processing device including an integrated circuit, a programmable logic device or the like, etc. The processor may also include a communication device such as a computer, a mobile phone, a portable/personal digital assistant ("PDA"), another device, or the like, which facilitates communications of information between end-users.

What is claimed is:

1. A circuit for measuring a battery cell voltage, the circuit comprising:

a plurality of battery cells included in a battery stack;

a device that measures a battery cell voltage;

a protection circuit connected in parallel to each terminal of the device that measures the battery cell voltage; and an external power supply configured to apply power to the protection circuit, wherein the protection circuit includes a diode connected in series to a resistor, and wherein in the protection circuit, a cathode of the diode is connected to one end of the resistor, and the other end of the resistor is connected to one of terminals of the device that measures the battery cell voltage.

2. The circuit of claim 1, wherein in the protection circuit, an anode of the diode is connected to an anode of the external power supply through a power terminal of the device that measures the battery cell voltage.

3. The circuit of claim 1, wherein in the battery stack, a cathode of the lowest battery cell, among the plurality of battery cells, is commonly connected to a cathode of the external power supply and a ground terminal of the device that measures the battery cell voltage.

4. The circuit of claim 3, wherein in the battery stack, the cathode of the lowermost battery cell is commonly connected to the cathode of the external power supply and the ground terminal of the device that measures the battery cell voltage through a bottom resistor and a bottom diode connected in parallel thereto.

5. The circuit of claim 4, wherein one end of the bottom resistor is connected to a cathode of the bottom diode and the cathode of the lowest battery cell in the battery stack, and the other end thereof is commonly connected to an anode of the bottom diode, the cathode of the external power supply, and the ground terminal of the device that measures the battery cell voltage.

6. The circuit of claim 1, wherein in the device that measures a battery cell voltage, each terminal and a cathode of each battery cell is connected in series with each other through a resistor, and a capacitor is connected in parallel between each terminal and each resistor.

* * * * *